United States Patent
Jung

(10) Patent No.: US 8,654,312 B2
(45) Date of Patent: Feb. 18, 2014

(54) OPTICAL COMPONENT FOR MASKLESS EXPOSURE APPARATUS

(71) Applicant: Jin Ho Jung, Icheon-si (KR)

(72) Inventor: Jin Ho Jung, Icheon-si (KR)

( * ) Notice: Subject to any disclaimer, the term of this patent is extended or adjusted under 35 U.S.C. 154(b) by 0 days.

(21) Appl. No.: 13/826,337

(22) Filed: Mar. 14, 2013

(65) Prior Publication Data

US 2013/0194561 A1  Aug. 1, 2013

Related U.S. Application Data

(62) Division of application No. 12/994,076, filed as application No. PCT/KR2009/002666 on May 20, 2009.

(30) Foreign Application Priority Data

May 20, 2008 (KR) .................. 10-2008-0046474
Dec. 3, 2008 (KR) .................. 10-2008-0121948

(51) Int. Cl.
G02B 5/04 (2006.01)
G03B 27/42 (2006.01)
G03B 27/54 (2006.01)

(52) U.S. Cl.
USPC ............................. 355/67; 355/53

(58) Field of Classification Search
CPC ................... G02B 5/04; G02B 5/045
USPC .................. 355/53, 67, 71, 77; 359/833–834, 359/850–851, 853
See application file for complete search history.

(56) References Cited

U.S. PATENT DOCUMENTS

| | | | | |
|---|---|---|---|---|
| 5,839,823 A | * | 11/1998 | Hou et al. | 362/327 |
| 2004/0233354 A1 | * | 11/2004 | Uehara et al. | 349/113 |
| 2005/0213068 A1 | * | 9/2005 | Ishii et al. | 355/67 |
| 2005/0286123 A1 | * | 12/2005 | Abu-Ageel | 359/443 |
| 2008/0094602 A1 | | 4/2008 | Tanitsu et al. | |
| 2009/0046262 A1 | | 2/2009 | Okazaki et al. | |

FOREIGN PATENT DOCUMENTS

| | | | |
|---|---|---|---|
| JP | 2006-261155 | 9/2006 | |
| KR | 10-2008-0022125 | 3/2008 | |
| WO | WO 2007/003563 | 1/2007 | |
| WO | WO 2009030980 A2 * | 3/2009 | ............ H01L 27/146 |

* cited by examiner

*Primary Examiner* — Toan Ton
*Assistant Examiner* — Colin Kreutzer
(74) *Attorney, Agent, or Firm* — Sherr & Jiang, PLLC

(57) ABSTRACT

Disclosed relates to an optical component for a maskless exposure apparatus, and more particularly, to a micro-prism array or a micro-mirror array which is an optical component capable of screening diffused light such that the image of a pixel of a digital micro-mirror display (DMD) formed by a first image-forming lens in the maskless exposure apparatus has no influence on the image of a neighboring pixel and of totally reflecting the light after reflection or diffraction at the same time, thus improving exposure performance by using the quantity of light being transmitted without a loss and increasing numerical apertures (NAs) at the same time.

5 Claims, 8 Drawing Sheets

OPTICAL COMPONENT FOR MASKLESS EXPOSURE APPARATUS

CROSS REFERENCE TO PRIOR APPLICATIONS

The present application is a Divisional Application of co-pending U.S. patent application Ser. No. 12/994,076 (filed on Nov. 22, 2010) under 35 U.S.C. §120, which is a National Stage Patent Application of International Patent Application No. PCT/KR2009/002666 (filed on May 20, 2009) under 35 U.S.C. §371, which claims priority to Korean Patent Application Nos. 10-2008-0046474 (filed on May 20, 2008), and 10-2008-0121948 (filed on Dec. 3, 2008), which are all hereby incorporated by reference in their entirety.

BACKGROUND

The present invention relates to an optical component for a maskless exposure apparatus, and more particularly, to a micro-prism array or a micro-mirror array which is an optical component capable of screening diffused light such that the image of a pixel of a digital micro-mirror display (DMD) formed by a first image-forming lens in the maskless exposure apparatus gives no influence on the image of a neighboring pixel and of totally reflecting the light after reflection or diffraction at the same time, thus improving exposure performance by using the quantity of light being transmitted without a loss and increasing numerical apertures (NAs) at the same time.

In general, the operation of passing light through a mask with a shape equal to or different from a circuit pattern to be made and transferring the shape from the mask to a photo-sensitizer using an optical system, i.e., the technique for forming a micro-pattern at a desired portion using a light source, is referred to as a photolithography process, and an apparatus for performing such a process is referred to as an exposure apparatus.

Such an exposure apparatus are frequently used in semiconductor industries, display industries, and the like. The exposure apparatus is divided into a proximity exposure apparatus and a projection exposure apparatus according to an exposure method. The projection exposure apparatus is divided into a large-area exposure apparatus (conventional exposure method) using a mask as illustrated in FIG. 12 and a maskless exposure apparatus (recently developed exposure method) using no mask as illustrated in FIG. 13.

The maskless exposure apparatus is an exposure method for reducing the image of a digital micro-mirror display (DMD) pixel with 13.8 μm down to 2 μm by using a DMD module with a pixel size of about 13.8 and a size of about 20 mm, a first image-forming lens called as a beam expander, a micro-lens array and an exposure lens called as an equimultiple second image-forming lens.

While the conventional large-area exposure apparatus using a mask is an apparatus for irradiating light onto a mask (reticle) from the back of the mask and performing large-area exposure by using one projection lens, the maskless exposure apparatus using a DMD rather than a mask is a recently developed exposure method. Since the area to be exposed is small, the maskless exposure apparatus selects a method for arranging several exposure optical systems (three exposure optical systems in FIG. 13) in parallel to expand the exposure area. In a case where the size of a pattern is relatively large, one projection lens is used as the exposure optical system. However, in a case where a micro-pattern is exposed, two projection lenses are used as the exposure optical systems, and a micro-lens array is interposed between the two projection lenses.

An example of the exposure apparatus using a maskless exposure method will be described. As illustrated in FIGS. 1, 2 and 3, the exposure apparatus includes a light source 10 for outputting (emitting) light Le; a light intensity distribution correcting optical system 20 for allowing the light Le outputted from the light source 10 to be incident thereto and correctly outputting the light Le so as to have approximately uniform light intensity distribution; a mirror 30 for reflecting the light Le outputted from the light intensity distribution correcting optical system 20 to bend the direction of a light path; a digital micro-mirror display (DMD) 40 having a TIR prism 50 for totally reflecting the light Le reflected by the mirror 30 and transmitting the totally reflected light Le to the DMD 40 and micro-mirrors 41 that are a plurality of pixel portions for respectively performing space light modulations in response to predetermined control signals; a first image-forming optical system 61 including lenses 61a and 61b for image-forming the light with respect to which the space image modulations are performed by the respective micro-mirrors 41; a micro-lens array 63 including a plurality of micro-lenses 63a arranged as optical components that are respectively disposed in the vicinity of the image-forming positions of the light Le image-formed by the first image-forming optical system 61 and individually pass the light Le therethrough; an aperture array 64 including a plurality of apertures; a second image-forming optical system 62 including lenses 62a and 62b for image-forming the light Le respectively passing through the micro-lenses 63a and the apertures 64a on a material 70 for printed circuit board; and the like.

However, in the conventional maskless exposure apparatus 100 performs expanded image forming with respect to the image of the DMD 40, which formed in the first image-forming optical system 61 so that the size of a pixel (micromirror) is 13 μm and the interval between pixels is 1 μm, on the micro-lens array 63. In a case where the performance of the first image-forming optical system 61 is perfect or the alignment of the first image-forming optical system 61 is perfect in manufacture, the shape of the expanded image is a shape illustrated in FIG. 3, in which the interval between pixels is perfectly shown. However, in an actual situation, light incident to each of the pixels is diffused or has a position error due to the resolution and distortion of lenses, the numerical difference of lenses, the alignment error of lenses, and the like, and therefore, has influence on a neighboring pixel. As a result, this has influence on the exposure performance on the exposure surface 70, and therefore, it is difficult to perfectly realize a desired shaped pattern.

Meanwhile, the first image-forming optical system 61 may perform expanded image forming such as 2 times, 2.5 times or 3 times, or may perform equimultiple image forming. In the invention, an optical system for performing equimultiple image forming will be described as an example.

That is, in a case where an equimultiple optical system is used as the first image-forming optical system, it is assumed that the size of the pixels is about 13.8 μm, the interval between the pixels is about 1 μm, and the size of the aperture array 64 is about 3 μm. Then, the entire light incident through the micro-lenses 63a is not effectively transmitted to the apertures 64a, and a portion of the light is transmitted to the apertures 64a. That is, since the micro-lenses 63a is generally formed in the shape of a convex lens, a portion of the light Le passing through the respective micro-lenses 63a is not perfectly concentrated and transmitted by refraction, diffusion, and the like, and loss of light quantity occurs. Therefore, the light Le is not effectively outputted to the aperture array 64 including the small-sized apertures 64a.

SUMMARY OF THE INVENTION

The present invention addresses the above-identified, and other problems associated with conventional methods and apparatuses. Embodiments provide an optical component for a maskless exposure apparatus, in which as light transmitted to a first image-forming optical system for image-forming light modulated by a digital micro-mirror display is prevented from being diffused to a neighboring pixel, it has no influence on the neighboring pixel, and as the light is simultaneously incident to a wide incident portion, it is concentrated by refraction or reflection, so that it is possible to use light without loss of light quantity and to enhance exposure performance.

According to an embodiment of the invention, there is provided an optical component for a maskless exposure apparatus including: a light source configured to emit light; a digital micro-mirror display (DMD) including a plurality of pixels each configured to modulate the light emitted from the light source according to a control signal; an optical system configured to form an image of the pixels from the light modulated by the pixels; a micro-lens array including a plurality of micro-lens on which the light modulated by the pixels and passing through the optical system is incident; and an image-forming optical system configured to form an image on a photosensitive material from the modulated light, the optical component including a micro-prism array used instead of the micro-lens array, the micro-prism array including a plurality of micro-prisms each having a wide light incident portion and a narrow light exit portion so that light passing through the micro-prisms is concentrated to increase light quantity.

According to another embodiment of the present invention, there is provided an optical component for a maskless exposure apparatus including: a light source configured to emit light; a digital micro-mirror display (DMD) including a plurality of pixels each configured to modulate the light emitted from the light source according to a control signal; an optical system configured to form an image of the pixels from the light modulated by the pixels; a micro-lens array including a plurality of micro-lens on which the light modulated by the pixels and passing through the optical system is incident; and an image-forming optical system configured to form an image on a photosensitive material from the modulated light, the optical component including a micro-mirror array used instead of the micro-lens array, the micro-mirror array including a plurality of micro-mirrors each having a wide light incident portion and a narrow light exit portion so that light passing through the micro-mirrors is concentrated to increase light quantity.

In the micro-prism array and the micro-mirror array, if an output angle with respect to an incident angle $\beta$ is given by $n(\beta/n+2m\alpha)$ and a prism-type light guide by reflection in air is used rather than the micro-prism, the n is 1 that is the refractive index of the air.

The micro-prism array and the micro-mirror array have a shape including any one of a quadrangular pyramid, a circular cone, a polygonal cone, and a combination thereof.

In case of one-time total reflection, the maximum of a total length L of the micro-prism or the micro-mirror is expressed as $L=(D1-D2)/(2\times\tan\alpha)$ and the minimum of the total length L of the micro-prism or the micro-mirror is expressed as $L=D1/(\tan\beta/n+\tan 2\alpha)$, and the micro-prism and the micro-mirror are selectively formed as one having a long total length or one having a short total length according to concentration efficiency of the exposure apparatus and an exposure line width.

The micro-prism array further includes a light diffusion preventing portion to screen diffusion light that has influence on a neighboring pixel.

The micro-prism is any one of a micro-prism not including a reflection coating for total reflection and a micro-prism including a reflection coating for artificial reflection.

An aperture array is additionally disposed at a side of the micro-prism array to improve an exposure surface contrast.

The micro-mirrors of the micro-mirror array is formed of a reflective metal member including a penetration incident portion and a penetration output portion.

In the micro-mirror array, light incident to the incident portion of the micro-mirror propagates while being reflected on an inner surface of the micro-mirror, and light partially diffused to an outer surface of the incident portion of the micro-mirror is screened by a light diffusion preventing area.

DETAILED DESCRIPTION

Figure 1:
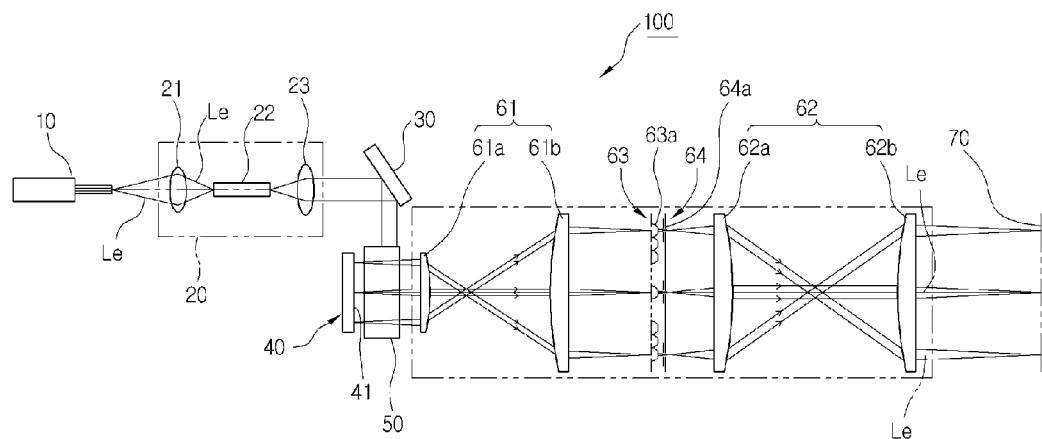
FIG. 1 illustrates an exposure apparatus having a conventional micro-lens array mounted therein.
Figure 2:
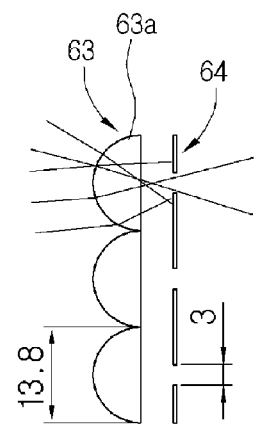
FIG. 2 illustrates a state that light is transmitted to the conventional micro-lens array.
Figure 3:
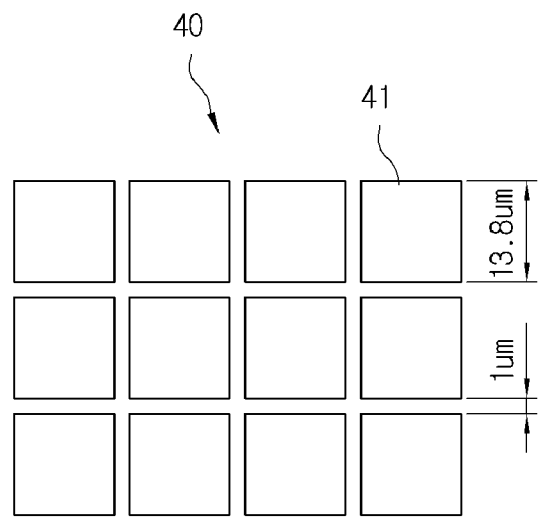
FIG. 3 illustrates an interval between pixels by enlarging a digital micro-mirror display (DMD)
Figure 4:
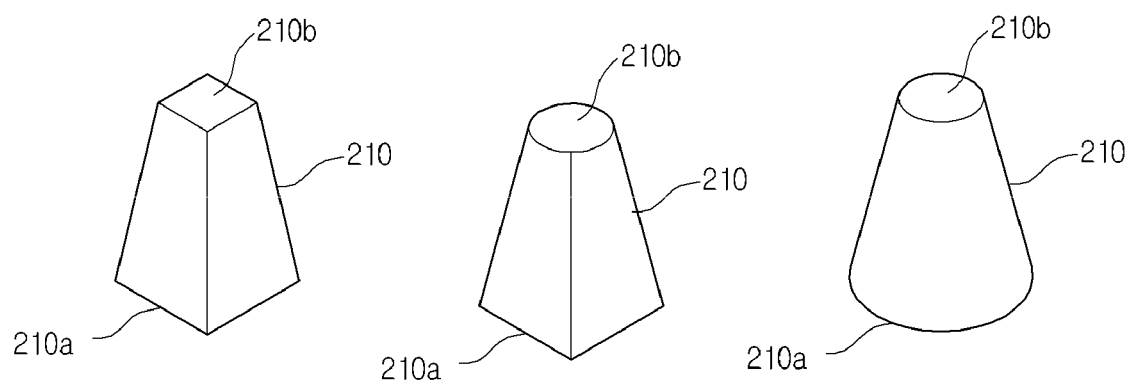
FIG. 4 illustrates micro-prisms according to an embodiment of the invention.
Figure 5:
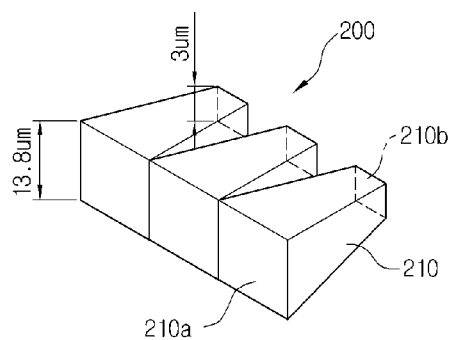
FIG. 5 illustrates a micro-prism array formed by arranging one of the micro-prisms illustrated in FIG. 4.
Figure 6:
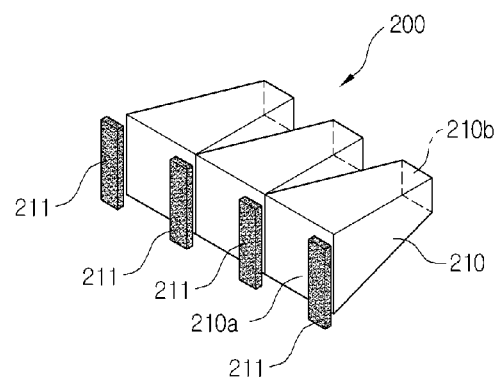
FIG. 6 illustrates an embodiment of the micro-prism array, in which quadrangular-pyramid micro-prisms are arranged with no gap therebetween, and light diffusion preventing portions are separately formed from the quadrangular-pyramid micro-prisms, respectively.
Figure 7:
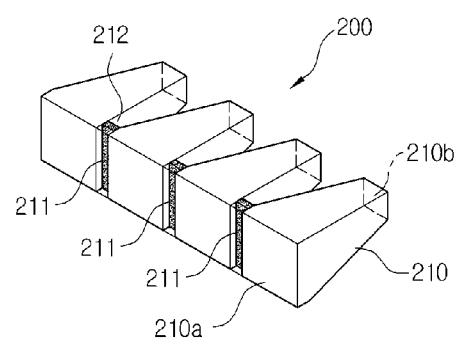
FIG. 7 illustrates another embodiment of the micro-prism array, in which quadrangular-pyramid micro-prisms are arranged with gaps therebetween, and light diffusion preventing portions are integrally formed in the gaps, respectively.

Hereinafter, exemplary embodiments of the invention will be described in detail with reference to the accompanying drawings.

In the following drawings, components having the same function denoted by the same reference numerals, and repetitive descriptions will be omitted. In addition, the following terminologies are defined by considering the functions in the invention, which are construed as commonly used meanings.

As illustrated in FIGS. 4 to 10, a micro-prism array 200 according to an embodiment of the invention includes a plurality of micro-prisms 210 arranged therein. In the micro-prisms 210, an incident portion 210a having light Le incident thereto is formed wider than an output portion 210b, and the output portion 210b is formed in a narrow manner.

The micro-prism 210 may be formed in the shape of a quadrangular pyramid, circular cone, polygonal cone or combination thereof.

For example, in the case of a combination shape, the incident portion 210a of the micro-prism 210 is formed in the shape of a square equal to that of a pixel of a digital micromirror display (DMD) 40, and the output portion 210b of the micro-prism 210 is formed in the shape of a square, circle or polygon according to the shape of a final desired pattern.

Here, the DMD 40 is a high technology for realizing high-definition images using a device for reflecting light Le, i.e., a technology for realizing high-brightness, high-resolution images by selectively reflecting light using an apparatus having hundreds of thousands of reflection-type devices integrated on one chip. The DMB is one of projection image display technologies developed via a projector, a cathode-ray tube and a liquid crystal display (LCD), but has high light efficiency and contrast as compared with a transmissive LCD which has been previously commercialized.

Light diffusion preventing portions 211 may be integrally formed or separately formed at a slight interval in the micro-prism array 200 including the micro-prisms 210.

Specifically, in the micro-prism array 200 having the light diffusion preventing portions 211 integrally or separately formed therein, the light diffusion preventing portion is formed at one side of each of the micro-prisms 210, i.e., at a front of a boundary portion between the incident portions 210a of the micro-prisms 210, which are successively arranged without a gap, or a gap 212 is formed between the micro-prisms 210 and the light diffusion preventing portion 211 is then formed in the gap 212. Thus, the light diffusion preventing portion 211 prevents light Le incident through a first image-forming optical system 61 from being diffused to a neighboring micro-prism 210, so that the light Le incident to a pixel has no influence on a neighboring pixel. Here, the first image-forming optical system 61 includes lenses 61a and 61b for image-forming each of the light Le with respect to which space light modulations are performed by the DMD 40.

The micro-prism 210 principally uses a total reflection, but if necessary, reflection coating may be applied to the micro-prism 210 so as to prevent light using no total reflection from reducing contrast by being transmitted to a total reflection surface.

That is, since exposure is generally performed using the total reflection, the reflection coating is not applied to the micro-prism 210. However, in order to prevent light from reducing the contrast, the reflection coating may be applied to the micro-prism 210 for the purpose of artificial reflection of light.

Accordingly, light can be perfectly reflected or totally reflected on the surface of the micro-prism 210.

In the micro-prism 210 configured as described above, light Le incident to the incident portion 210a are all transmitted to the output portion 210b by the total reflection, for example, in a light path in which the size of the incident portion 210a is 13.8 µm and the size of the output portion 210b is 3 µm.

Accordingly, the micro-prism array 200 of this embodiment can achieve an image-forming effect that the size of an image obtained by passing the light Le through the output portion 210b of the micro-prism 210 is identical to that of an image obtained by passing the light Le through an aperture array formed so that the large effective size (diameter) of the light Le transmitted to the conventional micro-lens is image-formed small. Therefore, it is unnecessary to form the aperture array.

However, if necessary, the aperture array may be additionally formed at one side of the micro-prism array 200 so as to enhance the contrast of the exposure surface.

Figure 8:
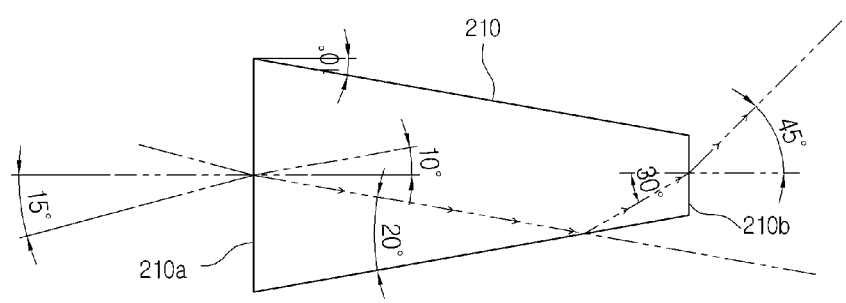
FIG. 8 illustrates a light path of a micro-prism according to the embodiment of the invention.

In a case where the micro-prism array 200 having the plurality of micro-prisms 210 arranged therein is formed as described above, it is assumed that when the initial incident angle is 15°, the refractive index of the micro-prism is 1.5. Then, the incident angle in the interior of the micro-prism is 10° (=15°/1.5) as illustrated in FIG. 8. If it is assumed that the inclination angle of the micro-prism is 10°, the angle of light with an inclined surface of the micro-prism is 20° when the light is totally reflected on the inclined surface.

If the angle of light with the inclined surface is 20°, the incident angle of the light with respect to the inclined surface is 70° (=90−20). In the total reflection condition according to the Snell's law, $n \sin \theta = n' \sin \theta'$, wherein n=1.5, n'=1.0 and θ=90°. Therefore, $\theta = \sin^{-1}(n' \sin \theta'/n) = \sin^{-1}(1/1.5) = 41.81°$, i.e., the incident angle of 70° is greater than the total reflection angle of 41.81°, and hence, the total reflection condition is satisfied.

The totally reflected light is incident at an incident angle of 30° with respect to the output surface, and is outputted at an output angle of 45° obtained by multiplying the refractive index (1.5) when it is finally outputted.

When the light is incident or reflected on the boundary surface of a micro-lens or micro-prism, $n \sin \theta = n' \sin \theta'$ is applied according to the Snell's law. In a case where the angle is small, it is possible to use $n\theta = n'\theta'$. Therefore, for convenience of illustration, the simple formula is applied to the incident and output of the light.

In this embodiment, if the plurality of micro-prisms 210 are arranged, the micro-prism array 200 is formed like a micro-lens array, an aperture array may be positioned at the back of the micro-prism array 200. Thus, the micro-prism array 200 becomes a new invention capable of substituting for the micro-lens array, so that the transmitted light quantity can be used approximately up to 100%.

Although it has been described that the incident angle of the light Le is 15° when the size of the incident portion 210a of the micro-prism 210 is 13.8 µm and the size of the output portion 210b of the micro-prism 210 is 3 µm, the incident angle of the light Le is a value considerably smaller than 15° in an actual case.

In the actual case, the incident angle may be calculated from resolution. That is, the size of pixels of the DMD for forming an initial pattern is 13.8 µm, and the interval between the pixels is 1 µm or so.

The resolution (resolution performance) of the first image-forming optical system (beam expander) positioned in front of the micro-prism array 200 is minimum 13.8 µm and maximum 1 µm.

The formula of the resolution is generally given by [resolution=λ(wavelength of light)/(2×NA(numerical aperture of lens)], and the result of the formula shows an NA when a modulation transfer function (MTF) value is 0.4 or so. Here, the MTF value is a value shown by comparing the image of a subject with the image of a lens, substantially formed on an imaging area by passing through the lens.

That is, if the wavelength λ of the light is 0.365 µm, i.e., the wavelength of ultraviolet and the wavelength of ultraviolet is properly applied as 0.35 μm, 13.8 μm (minimum resolution)=0.35 (2×NA)=>NA=n sin θ=0.01268, wherein n is an air refractive index of 1.0 and the angle θ=0.73°.

If the maximum resolution of 1 μm is applied, θ=10.08°, which is smaller than the initial incident angle of 15° in this embodiment of the invention.

Here, the incident angle β for determining the length of the micro-prism 210 is applied as 3° which is an approximately middle value.

Figure 9:
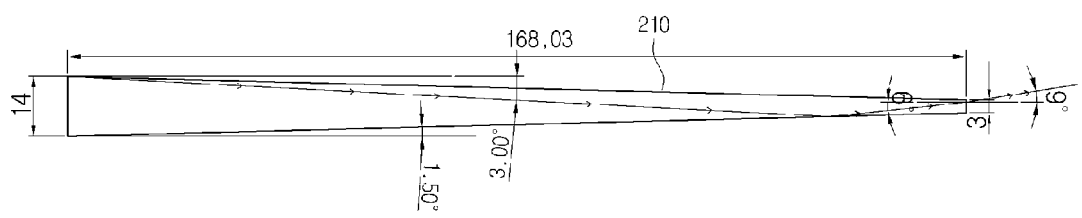
FIG. 9 schematically illustrates changes in the length of a micro-prism, the refraction angle according to an incident angle, the output angle according to the incident angle, and the like according to the embodiment of the invention.
Figure 9:
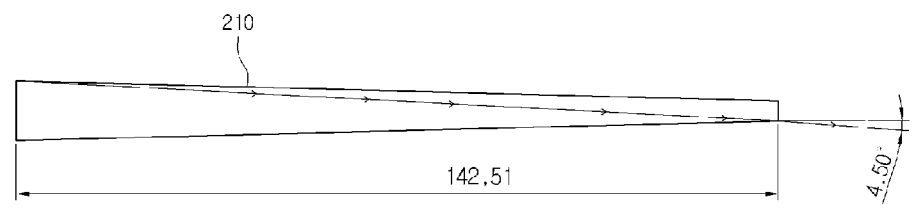
Figure 9:
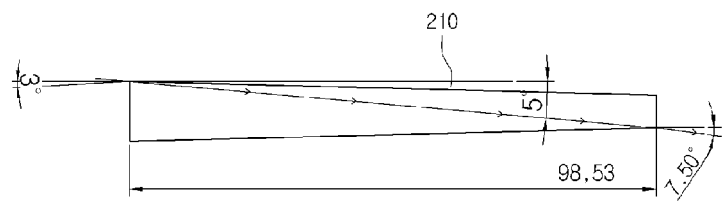
Figure 10:
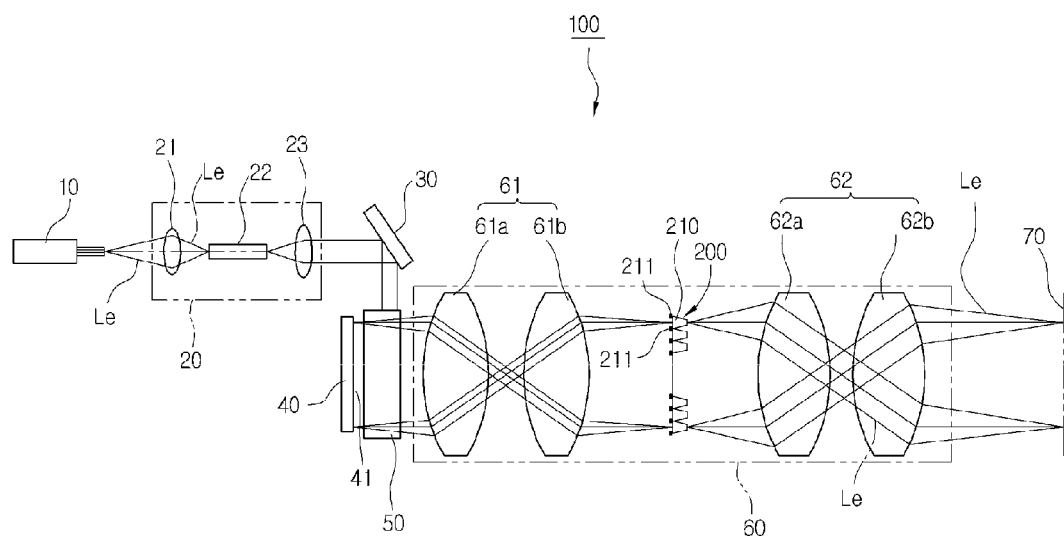
FIG. 10 illustrates a state that a micro-prism array is used according to the embodiment of the invention.

That is, as illustrated in FIG. 9, in a first method for determining the length L of the micro-prism 210, it is assumed that the size D1 of the incident portion 210a is 13.8 μm, the size D2 of the output portion 210b is 3 μm, and the inclination angle α is 1.5°.

$$\text{In } D2 = D1 - (2 \times L \times \tan\alpha), \qquad \text{(Equation 1)}$$

$$L(\text{length}) = (D1 - D2)/(2 \times \tan\alpha)$$
$$= (14 - 3)/(2 \times \tan 1.5)$$
$$= 210.04\ \mu m.$$

In a second method, it is assumed that the size D1 of the incident portion 210a is 13.8 μm, the inclination angle (α) is 1.5°, and the light (inclination angle of) 0°) incident parallel with an initial optical axis is reflected once at the upper end of the inclined surface and then transmitted to the lower end of the output surface.

$$\text{In } D1 = L \times (\tan\alpha + \tan 2\alpha), \qquad \text{(Equation 2)}$$

$$L(\text{length}) = D1/(\tan\alpha + \tan 2\alpha)$$
$$= 13.8/(\tan 1.5 + \tan 3)$$
$$= 178.13\ \mu m.$$

In a third method, it is assumed that the size D1 of the incident portion 210a is 13.8, the inclination angle α is 1.5°, the initial light is incident at an inclination angle β of 3°, and the final output light is reflected once at the upper end of the incident surface of the micro-prism 210 and then transmitted to the lower end of the output surface of the micro-prism 210.

The value of 3° before the initial incidence of light is divided by refraction to be 2° after the incident of the light. The angle of the light with the inclination surface for the total reflection at an upper portion of the inclination surface, i.e., the angle before the reflection is 3.5° (2+1.5), and the angle of the light with the optical axis is 5° (3.5+1.5).

Thus, it is assumed that the finally outputted light is reflected once at the upper end of the incident surface of the micro-prism 210 and then transmitted to the lower end of the output surface of the micro-prism 210.

$$\text{In } D1 = L(\text{length}) \times (\tan\beta/n + \tan 2\alpha), \qquad \text{(Equation 3)}$$

$$L = D1/(\tan\beta/n + \tan 2\alpha)$$
$$= 14/(\tan 3/1.5 + \tan 2 \times 1.5)$$
$$= 123.16\ \mu m.$$

Accordingly, the length of the micro-prism 210 may be minimum 123.16 μm to maximum 210.04 μm. The length of the micro-prism 210 may be determined in consideration of the total transmitted light quantity and the efficiency of manufacture.

In other words, in a case where the light is totally reflected once, the maximum of the length of the micro-prism is calculated by L=(D1−D2)/(2×tan α), and the minimum of the length of the micro-prism is calculated by L=D1/(tan β/n+tan 2α) when the light is incident at an incident angle of 3°.

The micro-prism 210 of this embodiment may be selectively formed as one having a long total length or one having a short total length.

For example, the total length of the micro-prism 210 is calculated by Equations 1, 2 and 3. In a case where the light is reflected once, the maximum of the range of the total length is calculated by Equation 1, and the minimum of the range of the total length is calculated by Equation 3.

That is, in a case where the light is totally reflected once, the maximum of the total length L of the micro-prism 210 is calculated by L=(D1−D2)/(2×tan α), and the minimum of the total length L of the micro-prism is calculated by L=D1/(tan β/n+tan 2α). Therefore, the micro-prism 210 in the range is selectively formed according to the concentration efficiency of the exposure apparatus, the width of an exposure line and the efficiency of manufacture.

Although it is illustrated in the aforementioned description that the light is totally reflected once, the light may be totally reflected two or more times.

That is, in FIG. 9, the light is incident parallel with the optical axis is totally reflected twice, and the final output angle of the light is 9°.

From the aforementioned description, the case where the light is reflected once than outputted is shown in the following Table 1.

TABLE 1

| Initial incident angle | Refraction angle | Angle with inclined surface after refraction | Angle with optical axis after being reflected once | Output angle after being reflected once |
|---|---|---|---|---|
| 0 | 0 | 10 | 20 | 30 |
| +15 | 10 | 20 | 30 | 45 |
| −15 | −10 | 0 | 10 | 15 |
| β | β/n | β/n + α | β/n + 2 α | n (β/n + 2α) |

Also, the case where the light is reflected twice and then outputted is shown in the following Table 2.

TABLE 2

| Initial incident angle | Refraction angle | Angle with inclined surface after refraction | Angle with optical axis after being reflected once | Angle with optical axis after being reflected twice | Output angle after being reflected twice (n = 1.5) |
|---|---|---|---|---|---|
| 0 | 0 | 10 | 20 | 40 | 60 |
| +15 | 10 | 20 | 30 | 50 | 75 |
| −15 | −10 | 0 | 10 | 30 | 45 |
| β | β/n | β/n + α | β/n + 2α | β/n + 4α | n(β/n + 4α) |

The final output angle of the light totally reflected three or more times (m times) is given by $n(\beta/n+2m\alpha)$.

Here, n denotes a refractive index of a prism medium, α denotes an angle of the inclined surface, β denotes an initial incident angle, and m denotes a number of total reflections. If a prism-type light guide by reflection in air is used rather than the micro-prism, n becomes 1, which is the refractive index of the air.

Thus, in the micro-prism array 200, the output angle with respect to the incident angle β is given by $n(\beta/n+2m\alpha)$.

The operation of this embodiment configured as described above will be described as follows.

First, when a photosensitive material stacked in the material 70 for printed circuit board is exposed using the exposure apparatus 100, the light Le outputted from the light source 10 is corrected as parallel light with an approximately constant light intensity distribution by the light intensity distribution correcting optical system 20 including a condensing lens 21, a load integrator 22 and a collimate lens 23. Then, the corrected light is reflected by the mirror 30 and incident to the DMD 40 by bending the direction of the light path.

The light Le incident to the pixel of the DMD 40 is subjected to space light modulation. Thus, when the micro-mirror 41 is in an on-state, the light Le is image-formed on the same plane perpendicular to the direction of the optical axis of the light path, i.e., in the micro-prism array 200 including the plurality of micro-prisms, which in one of optical components, while being reflected by the micro-mirror 41 and transmitted to the first image-forming optical system 61 including the lenses 61a and 61b.

In this instance, the light Le incident through the DMD 40 and the first image-forming optical system 61 is prevented from being diffused to a neighboring micro-prism 210 by the light diffusion preventing portion 211 formed in the micro-prism array 200, so as to have no influence on the neighboring pixel 210.

In the micro-prism 210, the size of the incident portion 210a is formed greater than the size of the output portion 210b, e.g., the size of the incident portion 210a is 13.8 μm and the size of the output portion 210b is 3 μm. Hence, the light Le incident to the incident portion 210a with the size of 13.8 μm are all transmitted to the output portion 210b with the size of 3 μm by the total reflection.

Thus, partially diffused light is prevented from being diffused by the light diffusion preventing portion 211 to have no influence on the neighboring pixel, and are effectively concentrated to have no loss of light quantity. Accordingly, the light quantity can be used almost up to 100% and much more considerably increased than that in the related art.

Subsequently, the light Le image-formed in the micro-prism array 200 is enlarged while passing through the second image-forming optical system 62 including the lenses 62a and 62b so that the image of a line pattern is formed on the photosensitive material of the material 70 for printed circuit board, and each exposure area on the photosensitive material is exposed, thereby enhancing exposure performance.

Figure 11:
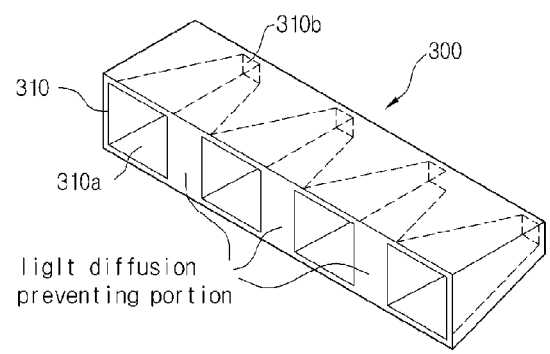
FIG. 11 illustrates a micro-mirror array in which a plurality of micro-mirrors each having incident and output portions transmitted to a reflective metal member are arranged, in place of a refractive micro-prism array, according to another embodiment of the invention.
Figure 12:
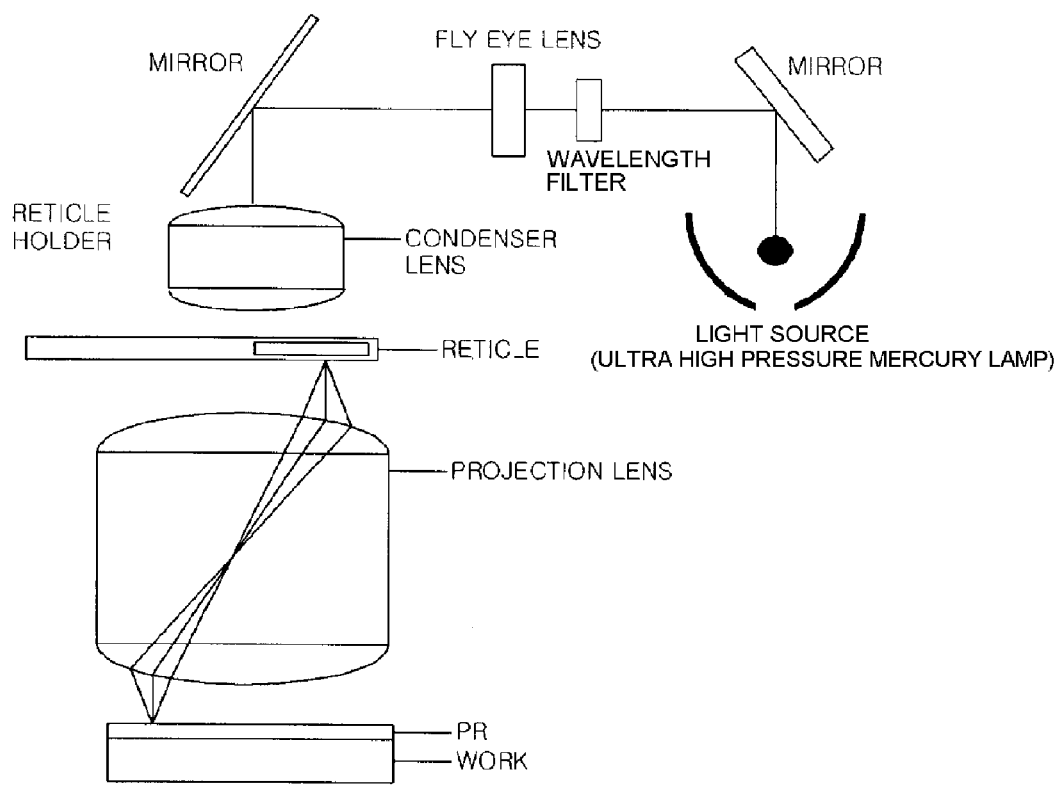
FIG. 12 illustrates a large-area exposure apparatus.
Figure 13:
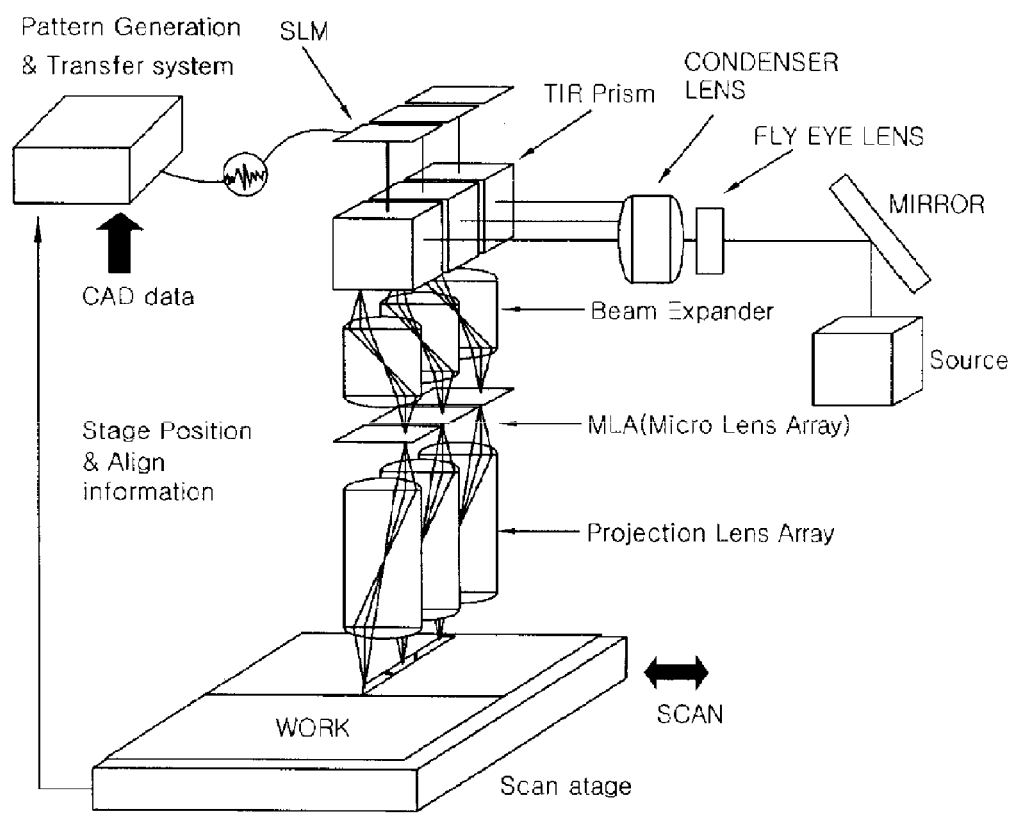
FIG. 13 illustrates a maskless exposure apparatus using no mask.

Meanwhile, FIG. 11 illustrates another embodiment of the invention. In FIG. 11, a micro-mirror array 300 including a plurality of micro-mirrors 310 arranged therein is formed rather than the micro-prism array 200 using the refraction method, so that the light diffusion preventing portion 211 for preventing the diffusion of light is not separately formed. Here, each of the plurality of the micro-mirrors 310 has an incident portion 310a and an output portion 310b, which pass through each other and are formed in the shape of a circular cone, polygonal cone or combination thereof. That is, the micro-mirror array 300 is formed of a metal member to achieve the prevention of light diffusion and the concentrated transmission of incident light.

Here, the configuration of the micro-mirror array 300 is identical to that of the micro-prism array 200, except the material and the configuration of the incident and output portions.

More specifically, the micro-mirror array 300 is different from the micro-prism array 200 in that after light Le is incident to each micro-mirror 310 having an incident portion 310a and an output portion 310b, which pass through each other and are formed of a reflective metal member in the shape of a quadrangular pyramid, circular cone or polygonal cone, it is reflected on an inner surface of the micro-mirror 310, and the light Le partially diffused to the outside of the micro-mirror 310 is screened by a light diffusion preventing area formed at an outer portion of the incident portion 310a of the micro-mirror, so that the diffused light Le having influence on a neighboring pixel is naturally screened. However, the conditions of configurations of other components in the micro-mirror array 300 are identical to those in the micro-prism array 200.

In the embodiments of the invention described above, as an incident portion is formed in a wide manner and an output portion is formed in a narrow manner, light incident from a DMD is concentrated by refraction and reflection, and as a light diffusion preventing portion is formed, light is prevented from being diffused by the light diffusion preventing portion so as to have no influence on a neighboring pixel due to the diffusion or movement of the light of a pixel. Accordingly, light is more effectively concentrated and transmitted, so that it is possible to use light up to 100% without the loss of light quantity and to enhance exposure performance.

The invention described above is not limited to the aforementioned embodiments and the accompanying drawings. It will be apparent to those skilled in the art that various substitutions, modifications and changes can be made thereto without departing from the technical spirit of the invention.

What is claimed is:

1. An optical component for a maskless exposure apparatus comprising:

a light source configured to emit light;

a digital micro-mirror display (DMD) comprising a plurality of pixels each configured to modulate the light emitted from the light source according to a control signal;

a first optical system configured to form an image of the pixels from the light modulated by the pixels of the digital micro-mirror display;

a second optical system configured to form the image, formed by the first optical system, on a photosensitive material;

a micro-prism array positioned between the first and second optical systems and comprising a plurality of micro-prisms each having a light incident portion and a light exit portion narrower than the light incident portion so that the light passing through the micro-prisms is concentrated to increase light quantity and the concentrated light is transmitted to the second optical system; and a plurality of light prevention portions each positioned between neighboring light incident portions of the plurality of micro-prisms, wherein the plurality of light prevention portions allow the light going toward each light incident portion to pass through each micro-prism and reach the second optical system while screening diffused light going toward spaces between the neighboring light incident portions so that the diffused light has no influence on neighboring pixels, wherein in case of one-time total reflection, the maximum of a total length L of the micro-prism is expressed as $L=(D1-D2)/(2 \times \tan 2\alpha)$ and the minimum of the total length L of the micro-prism is expressed as $L=D1/(\tan \beta/n + \tan 2\alpha)$, wherein said D1 denotes a width of the light incident portion, said D2 denotes a width of the light exit portion, said $\alpha$ denotes an angle between a prism surface and a surface normal to the light incident portion, said $\beta$ denotes an incident angle of the light, and said n denotes a refractive index of an air.

2. The optical component according to claim 1, wherein in the micro-prism array, an output angle with respect to the incident angle $\beta$ is given by $n(\beta/n+2m\alpha)$, wherein said m denotes the number of reflections of the beam of light in the micro-prism array.

3. The optical component according to claim 1, wherein the micro-prisms have a shape including any one of a quadrangular pyramid, a circular cone, a polygonal cone, and a combination thereof.

4. The optical component according to claim 1, wherein the micro-prism is any one of a micro-prism not comprising a reflection coating for total reflection and a micro-prism comprising a reflection coating for artificial reflection.

5. The optical component according to claim 1, wherein an aperture array is additionally disposed at a side of the micro-prism array to improve an exposure surface contrast.

* * * * *